United States Patent
Miyake et al.

(10) Patent No.: US 11,202,381 B2
(45) Date of Patent: Dec. 14, 2021

(54) CONNECTION DEVICE

(71) Applicants: Kabushiki Kaisha Toshiba, Tokyo (JP); Toshiba Electronic Devices & Storage Corporation, Tokyo (JP)

(72) Inventors: Eitaro Miyake, Kawasaki Kanagawa (JP); Daisuke Ando, Yokohama Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 17/016,955

(22) Filed: Sep. 10, 2020

(65) Prior Publication Data
US 2021/0176877 A1    Jun. 10, 2021

(30) Foreign Application Priority Data
Dec. 5, 2019 (JP) ............................. JP2019-220472

(51) Int. Cl.
*H05K 5/02* (2006.01)
(52) U.S. Cl.
CPC ......... *H05K 5/0221* (2013.01); *H05K 5/0247* (2013.01)
(58) Field of Classification Search
None
See application file for complete search history.

(56) References Cited

U.S. PATENT DOCUMENTS

| | | | | |
|---|---|---|---|---|
| 6,315,142 B1 * | 11/2001 | Kitamura | ............ | H04M 1/0252 220/324 |
| 6,666,706 B1 * | 12/2003 | Jones | .................... | H01R 13/506 439/353 |
| 7,133,279 B2 * | 11/2006 | Lin | ....................... | G11B 33/124 361/679.33 |
| 7,413,479 B1 * | 8/2008 | Volpone | ............... | H01R 13/506 174/138 F |
| 8,113,853 B2 * | 2/2012 | Coyle, Jr. | ............... | H02S 40/34 439/76.1 |
| 8,648,264 B2 * | 2/2014 | Masumoto | ............. | H02G 3/081 174/520 |
| 9,437,953 B2 * | 9/2016 | Lappoehn | ............ | H01R 13/639 |

(Continued)

FOREIGN PATENT DOCUMENTS

JP    H11-251513 A    9/1999
JP    3361266 B2    1/2003
JP    5524301 B2    6/2014

*Primary Examiner* — Xanthia C Cunningham
(74) *Attorney, Agent, or Firm* — Allen & Overy LLP (57) ABSTRACT

According to one embodiment, a connection device includes an engaging claw extending in a first direction from a first member, and a receiving portion provided in a second member. The engaging claw includes a pair of first side surfaces, and a pair of engaging protrusions projecting out from the respective side surface. Each engaging protrusion includes an inclined surface continuous from the first side surface and inclined to the first direction. The receiving portion includes a pair of slopes extending in the first direction and each including a second side surface engaging the first side surface, and an engaging projection connected to the second side surface, the engaging projection engaging the engaging protrusion.

9 Claims, 7 Drawing Sheets

(56) References Cited

U.S. PATENT DOCUMENTS

| | | | |
|---|---|---|---|
| 9,455,503 B2* | 9/2016 | Mathews | H01R 4/242 |
| 9,456,095 B2* | 9/2016 | Tsubakimoto | F16B 5/0664 |
| 9,609,763 B2* | 3/2017 | Gerst | F16B 5/0664 |
| 10,154,600 B1* | 12/2018 | Yamaguchi | H02G 3/081 |
| 10,644,438 B2* | 5/2020 | Li | H01R 13/62916 |
| 2005/0145410 A1* | 7/2005 | Daito | H02G 3/0418 |
| | | | 174/72 A |
| 2006/0103140 A1* | 5/2006 | Bella | E05B 65/5223 |
| | | | 292/95 |
| 2010/0272402 A1 | 10/2010 | Fukui et al. | |
| 2012/0027359 A1* | 2/2012 | Katoh | G02B 6/3885 |
| | | | 385/78 |
| 2015/0382497 A1* | 12/2015 | Kawamura | H01R 13/4362 |
| | | | 361/728 |
| 2018/0059741 A1* | 3/2018 | Huang | G06K 19/077 |
| 2018/0162719 A1* | 6/2018 | Matsumura | B68G 7/12 |
| 2018/0178735 A1* | 6/2018 | Kamei | F16B 2/22 |
| 2019/0223306 A1* | 7/2019 | Hattori | H05K 5/03 |
| 2019/0348824 A1* | 11/2019 | Ikeda | H01R 13/518 |
| 2020/0153129 A1* | 5/2020 | Iwai | H01R 12/58 |

\* cited by examiner

CONNECTION DEVICE

CROSS-REFERENCE TO RELATED APPLICATIONS

This application is based upon and claims the benefit of priority from Japanese Patent Application No. 2019-220472, filed Dec. 5, 2019, the entire contents of which are incorporated herein by reference.

FIELD

Embodiments described herein relate generally to a connection device for connecting a first member and a second member to each other.

BACKGROUND

Electronic devices, electrical devices and other various devices comprise a connecting structure (connection device) to connect a second member which constitutes the housing or the like and a first member which constitutes a cover or the like, to each other. For example, as a connection device of such a configuration, a connection device is widely used, that comprises a receiving portion provided in the second member and an engaging claw extending from the first member to fit the receiving portion.

Engaging claws are usually formed of a synthetic resin or the like so as to be elastically deformable. Therefore, when an excessive external force acts on the engaging claw while the engaging claw engaging with or fitting an engaging projection of the receiving portion, such a glitch may occur that the engaging claw elastically deforms to come off from the engaging projection. In the case of a general L-shape engaging claw, when a large load acts in a direction that the engaging claw comes off, the stress concentrates on an inner corner portion of the L-shape, and crack may occur to the engaging claw. In some cases, the engaging claw is damaged to come off from the engaging projection. Or, if not damaged, the engaging claw may come off from the engaging projection as it bending in a direction spaced away from the receiving portion.

DETAILED DESCRIPTION

Various embodiments will be described hereinafter with reference to the accompanying drawings. In general, according to one embodiment, a connection device comprises an engaging claw extending in a first direction from a first member, and a receiving portion provided in a second member, to fit with the engaging claw. The engaging claw comprises a pair of first side surfaces each extending in the first direction and opposing each other with an interval therebetween, and a pair of engaging protrusions provided in an extending end portion of the engaging claw and each projecting out from the respective first side surface in a direction intersecting the first direction, the engaging protrusions each comprising an inclined surface continuous from the first side surfaces and extending to be inclined with respect to the first direction. The receiving portion comprises an insertion opening to which the engaging claw is inserted, a pair of slopes extending in the first direction and each including a second side surface engaging the first side surface, and an engaging projection connected to the second side surface, the engaging projection engaging the engaging protrusion.

The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes and the like, of the respective parts are illustrated schematically in the drawings, rather than as an accurate representation of what is implemented. However, such schematic illustration is merely exemplary, and in no way restricts the interpretation of the invention. Further, in the specification and drawings, the same elements as those described in connection with preceding drawings are denoted by like reference numbers, and detailed description thereof is omitted unless necessary.

Embodiments

Electrical apparatus comprising a connection device according to embodiments will be described.

As an example of the electrical apparatus, a semiconductor device according to the embodiment will be described in detail.

Figure 1:
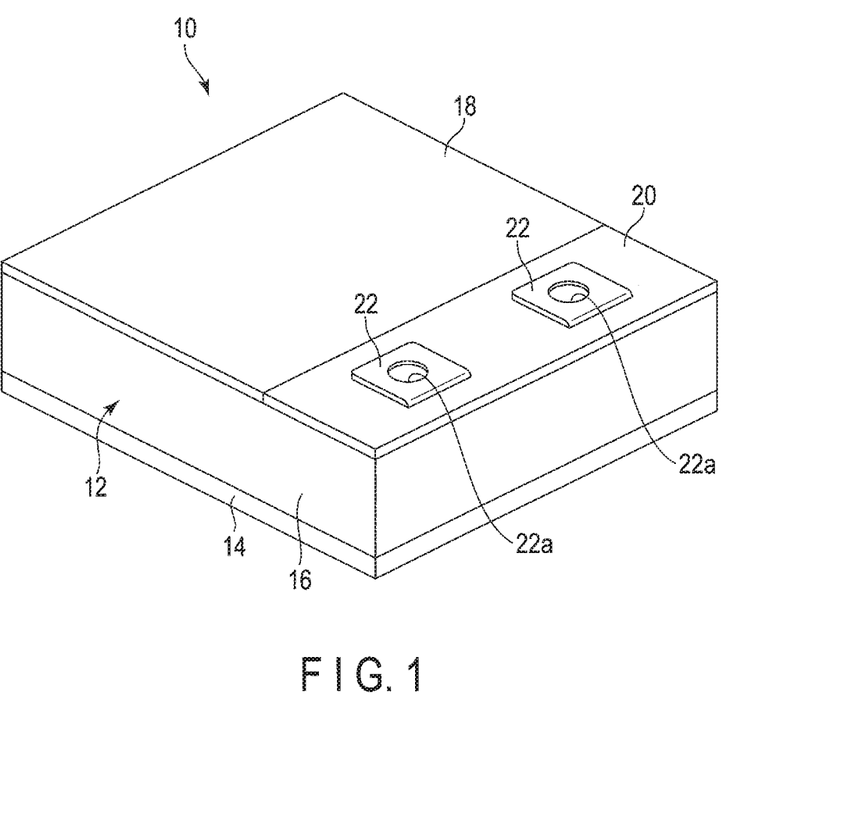
FIG. 1 is a perspective view showing a semiconductor device comprising a connection device (connecting mechanism) according to an embodiment.
Figure 2:
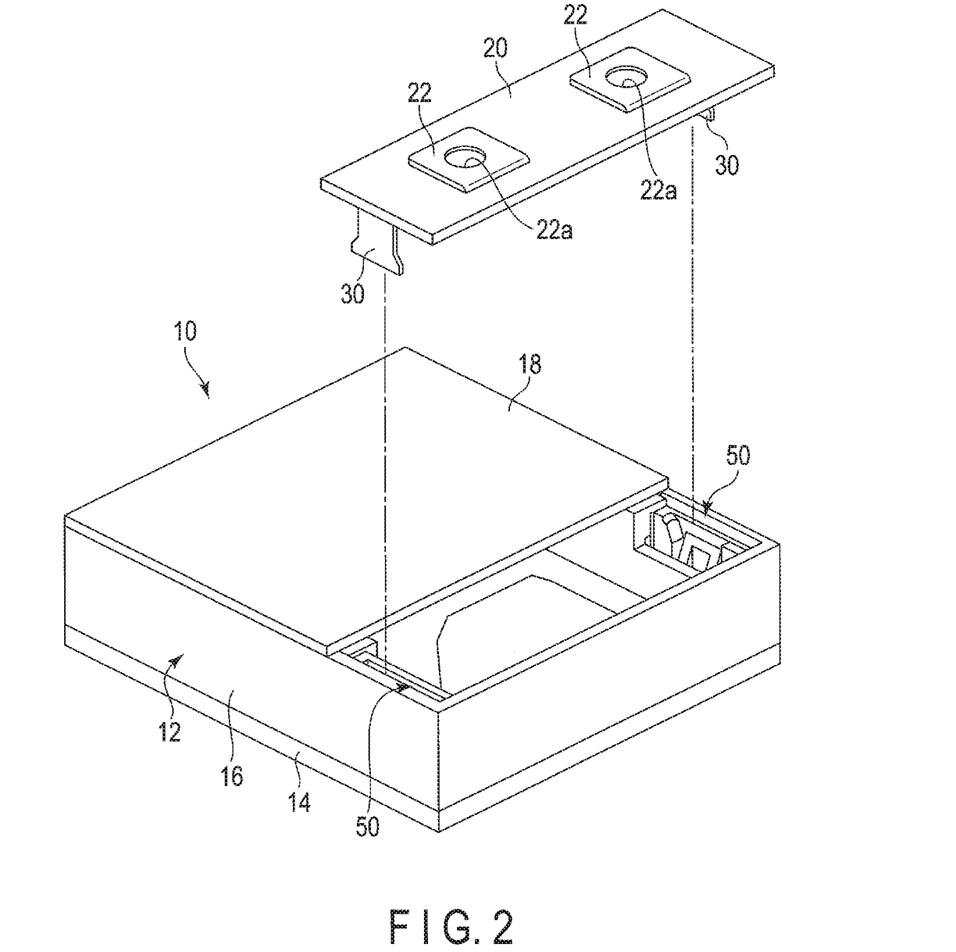
FIG. 2 is an exploded perspective view showing the semiconductor device when a second cover is removed.
Figure 3:
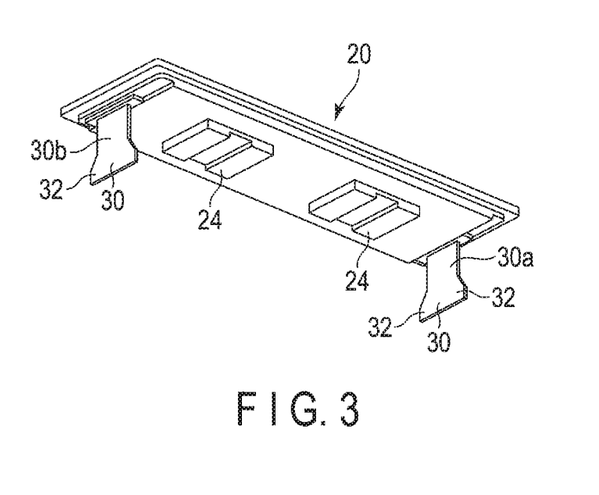
FIG. 3 is a perspective view showing the second cover as viewed from a back side.

FIG. 1 is a perspective view showing the appearance of the semiconductor device. FIG. 2 is an exploded perspective view showing the semiconductor device when a second cover is removed. FIG. 3 is a perspective view showing the second cover as viewed from a back side.

As shown in FIG. 1, a semiconductor device 10 comprises a substantially rectangular box-shaped housing 12 formed of a synthetic resin or the like. The housing 12 includes a rectangular plate-shaped base 14, a rectangular frame (case) 16 fixed on the base 14, a first cover 18 and a second cover 20 which cover an upper opening of the case 16.

On an inner surface of the base 14, a plurality of circuit boards (not shown) on each of which a plurality of semiconductor elements are implemented are disposed, and thus accommodated in the housing 12. The first cover 18 is formed into a rectangular plate shape. The first cover 18 is attached to a pair of longitudinal sidewalls of the case 16 and covers the most of the upper opening of the case 16. The first cover 18 is fixed to the sidewalls of the case 16 by adhesion or with an engaging claw.

As shown in FIGS. 1 and 2, the second cover (the first member) 20 is formed into substantially a rectangular plate shape. The second cover 20 is connected and fixed to the sidewalls of the case 16 by a connection device, which will be described later, so as to cover the upper opening of the case 16. On the second cover 20 formed of a synthetic resin, metal parts such as connection terminals may be provided, or the second cover 20 and the metal parts may be molded as an integral body by, for example, insert molding or the like. In this embodiment, a pair of terminals 22 are installed on the second cover 20. As shown in FIG. 3, a pair of conductive members 24 respectively connected to the terminals 22 are provided on a back surface of the second cover 20. The terminals 22 and conductive members 24 are formed as an integral body from, for example, a conductive metal such as copper. The terminals 22 are electrically connected to the circuit boards in the housing 12 via the conductive members 24. Further, the terminals 22 each comprise a connecting terminal (not shown) or a screw hole 22a to screw a bus bar.

As shown in FIGS. 2 and 3, the second cover 20 includes a pair of engaging claws 30, as an integral body, extending substantially perpendicular from the respective longitudinal ends thereof. On the longitudinal sidewalls of the case (the second member) 16, a pair of receiving portions 50 are respectively provided. By fitting the pair of engaging claws 30 with the receiving portions 50, respectively, the second cover 20 is attached and fixed to the case 16. The engaging claws 30 and the receiving portion 50 constitute the connection device (connecting mechanism) of this embodiment.

Next, the connection device will be described in detail.

Figure 4:
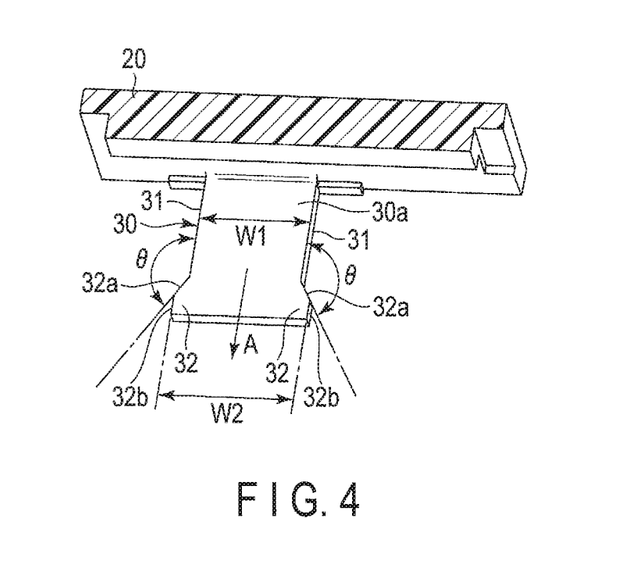
FIG. 4 is a perspective view showing an engaging claw portion of the second cover.

FIG. 4 is an enlarged perspective view showing an engaging claw portion of the second cover.

As shown, the engaging claw 30 formed into a rectangular plate shape and includes a proximal end fixed to the cover 20, an extending end extending by a predetermined length and a pair of engaging protrusions 32 projecting from the extending end to lateral sides. The engaging claw 30 extends substantially perpendicular to a bottom surface of the second cover 20 and substantially parallel to the sidewalls of the case 16. In other words, the engaging claw 30 comprises substantially a rectangular and flat first main surface 30a, a second main surface 30b opposing substantially parallel to the first main surface 30a, and a pair of side surfaces (first side surface) 31 extending in an extending direction A of the engaging claw 30 and opposing each other with an interval therebetween. The first main surface 30a and the second main surface 30b each extend substantially perpendicular to the bottom surface of the second cover 20 and substantially parallel to inner surfaces of the sidewalls of the case 16. The pair of side surfaces 31 are substantially perpendicular to the bottom surface of the second cover 20 and normal to the first main surface 30a and the second main surface 30b. For example, the engaging claw 30 has a width (an interval between the pair of side surfaces 31) W1 of about 10 mm and has a thickness of about 1 mm.

The engaging claw 30 includes a pair of engaging protrusions 32 projecting from respective side surfaces of the extending end to respective sides in the width direction and formed to be integrated with the claw as one body. A width W2 of the extending end portion including the pair of engaging protrusions 32 is greater than the width W1 of the other parts. The width W2 is set to 1.1 to 1.3 times of the width W1 and is set to, for example, 12 mm. Thus, a projecting height (a projecting height with respect to the side surfaces 31) of each engaging protrusion 32 is set to about 1 mm.

The engaging protrusions 32 each comprises inclined surfaces 32a continuous from the side surfaces 31, respectively, and extending to be inclined with respect to the extending direction A, and end surfaces 32b extending from the respective inclined surfaces 32a to an extending end of the engaging claw and parallel to the extending direction A. An angle θ made between each side surface 31 and the respective inclined surface 32a is greater than 90°, and, for example, it is set to about 120° to 160°. In this embodiment, the angle θ is set to 150°.

The engaging claw 30 is formed integrally with the second cover 20 as one body from a synthetic resin, for example, polyamide, so as to be elastically deformable in a direction in which the first main surface 30a and the second main surface 30b intersect each other. Note that such a configuration may as well be adopted that an engaging claw 30 formed as a member separate from the second cover 20 is fixed to the second cover 20.

Figure 5:
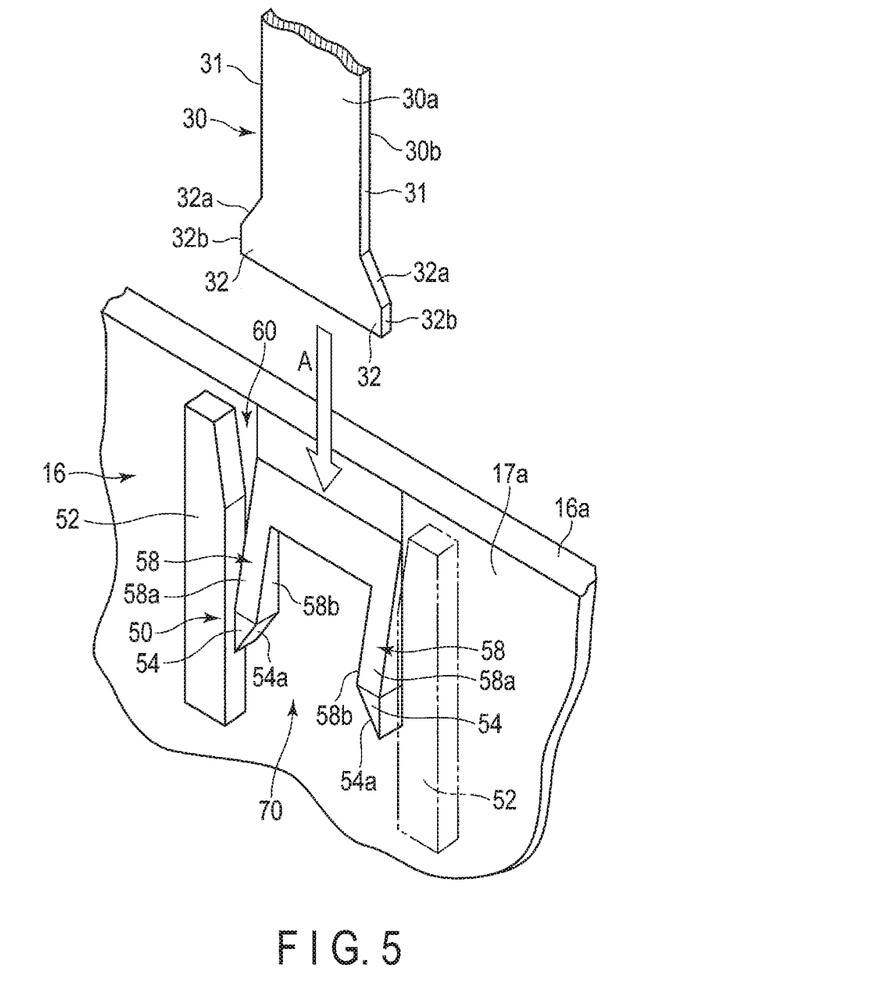
FIG. 5 is an exploded perspective view showing a receiving portion and an engaging claw provided in a housing of the semiconductor device.

FIG. 5 is a perspective view showing the engaging claw and the receiving portion. As shown, the receiving portion 50 provided on the sidewall 16a of the case 16 comprises a pair of guide ribs 52 standing on the inner surface 17a of the sidewall 16a, a pair of engaging projections 54 provided between the guide ribs 52, a pair of slopes 56 extending to be inclined from the inner surface 17a of the sidewall 16a to the respective engaging projection 54.

A pair of guide ribs 52 each extend substantially perpendicular to an upper edge of the respective sidewall 16a and the interval between the guide ribs 52 is set slightly greater than the width W2 of the extending end portion of the engaging claw 30. A pair of upper end portions of the guide ribs 52 and the inner surface 17a of the sidewall 16a define an insertion opening 60 for the engaging claw 30.

A pair of engaging projections 54 are formed to project from the inner surface 17a of the sidewall 16a and abut against inner side surfaces of the guide ribs 52, respectively. The engaging projections 54 are formed to have a projecting height that is less than a projecting height of the guide ribs 52. An interval between the pair of engaging projections 54 is set to be greater than the width W1 of the engaging claw 30 but less than the width W2 of the extending end portion. It is desirable that the projecting height of the engaging projection 54 greater than or equal to the thickness of the engaging claw 30.

The pair of slopes 58 extend in the extending direction and each including a second side surface engaging the first side surface, an engaging projection connected to the second side surface, the engaging projection engaging the engaging protrusion. The slopes 58 each include a strip-shaped guide surface (inclined surface) 58a extending to be inclined from the inner surface 17a of the sidewall in the vicinity of the insertion opening 60 to a projecting end of the engaging projection 54 and side surfaces (second side surfaces) 58b standing substantially perpendicular with respect to the inner surface 17a. The respective side surface 58b connected to the engaging projection 54 (engaging surface 54a) engages the side surface 31 of the engaging claw 30. The guide surface 58a extends in the extending direction (insertion direction) A and also extends to be inclined with respect to a direction spaced away from the inner surface 17a to be connected to the end surface of the engaging projection 54.

The side surfaces 58b each extend parallel to the respective guide ribs 52, that is, in the extending direction A.

An interval between the pair of slopes 58 is slightly greater than the width W1 of the engaging claw 30 and also sufficiently less than the width W2 of the extending end portion.

The engaging projection 54 includes engaging surfaces 54a each extending to be inclined from an lower end of the respective side surface 58b to the vicinity of the respective guide rib 52. The engaging surface 54a stands substantially perpendicular with respect to the inner surface 17a of the sidewall 16a. An angle θ made between the side surface 58b (extending direction A) and the respective engaging surface 54a is substantially the same as the angle θ of the inclined surface of the engaging claw 30 described above. The respective engaging surface 54a engages the inclined surface 32a of the engaging protrusion 32.

The inner surface 17a of the sidewall 16a, a region between the pair of slopes 58, a region between the pair of engaging projections 54 and a region between the pair of guide ribs 52 define a receiving region 70 to hold the engaging claw 30.

Figure 6:
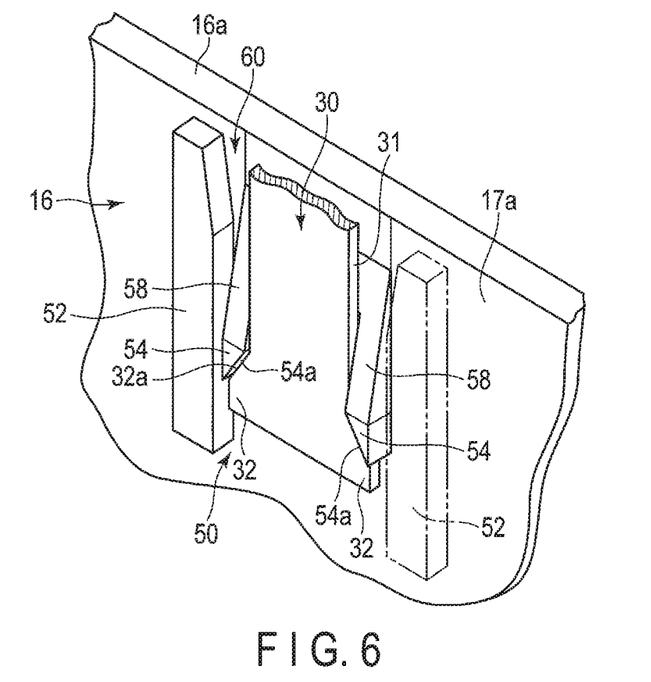
FIG. 6 is a perspective view showing the receiving portion in the state where the engaging claw is fit.
Figure 7A:
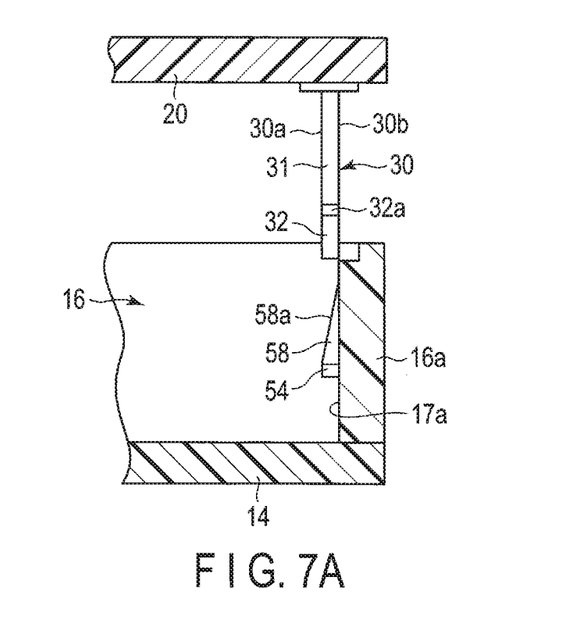
FIG. 7A is a cross-sectional view schematically showing the process of fitting the engaging claw with the receiving portion.
Figure 7B:
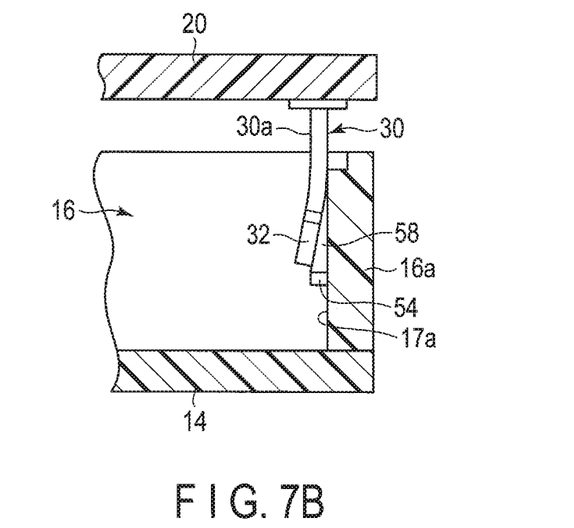
FIG. 7B is a cross-sectional view schematically showing the state where the engaging claw is elastically deformed in the fitting process.
Figure 7C:
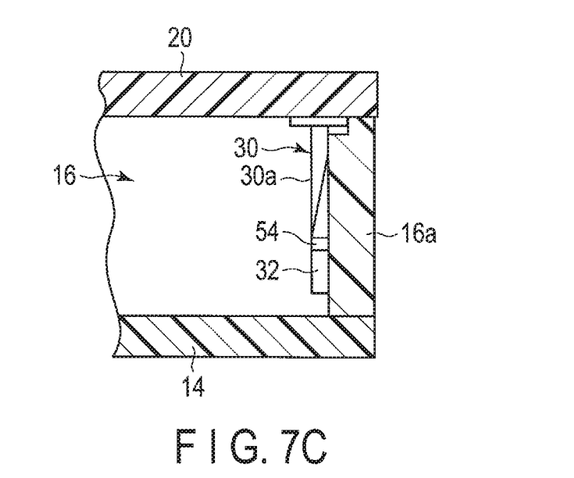
FIG. 7C is a cross-sectional view schematically showing the state where the engaging claw is fit with a predetermined position of the receiving portion in the fitting process.

FIG. 6 is a perspective view showing the case in the state where the encaging claw 30 is attached and fit with the receiving portion 50. FIGS. 7A, 7B and 7C are each a cross-sectional view schematically showing the process of connecting the engaging claw 30 to the receiving portion 50. FIG. 3 is a front view showing the engaging claw 30 and the receiving portion 50 in the state they fit each other.

In order to connect and fix the second cover 20 to the case 16, as shown in FIGS. 5 and 7A, the second cover 20 is placed to a position where the pair of engaging claws 30 are located above the receiving portions 50 of the case 16, and then the second cover 20 is pushed down towards the case 16. In the extending direction (insertion direction) A, the pair of engaging claws 30 are inserted to the receiving portions 50 through the insertion openings 60, respectively.

As seen in FIG. 7B, as the engaging claws 30 descend, the pair of engaging protrusions 32 slides on the guide surfaces 58a of the pair of slopes 58, respectively. Thus, the engaging claws 30 elastically deforms in a direction spaced from the inner surfaces 17a of the sidewalls 16a along the inclination of the slopes 58. As seen in FIG. 7C, when the engaging claws 30 are further pushed and the engaging protrusions 32 climb over the engaging projections 54, respectively, the engaging claws 30 recover an original flat shape.

Figure 8:
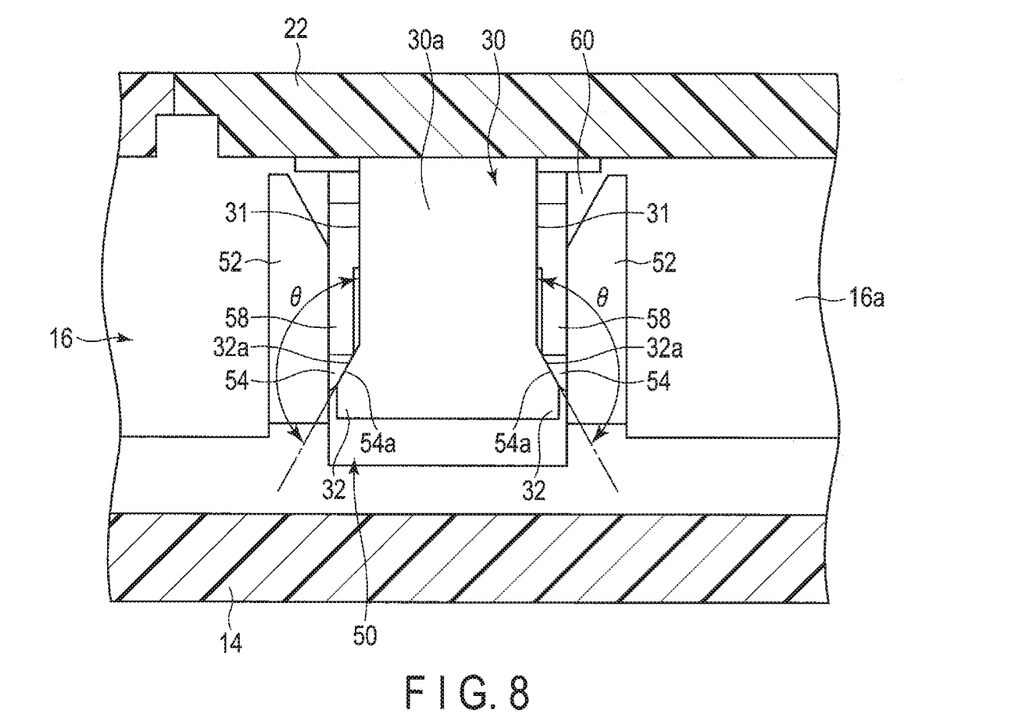
FIG. 8 is a front view showing the engaging claw and the receiving portion in the state they fit with each other.

As described, as shown in FIGS. 6 and 8, the engaging claws 30 are stored in the receiving regions 70 of the receiving portions 50, respectively, and the pair of engaging protrusions 32 are hooked on the engaging projections 54 of the receiving portions 50. That is, the inclined surface 32a of each engaging protrusion 32 abuts against and opposes the engaging surface 54a of the respective engaging projection 54, thereby engaging the engaging surface 54a. Thus, as the pair of engaging claws 30 fit the receiving portions 50 of the case 16, respectively, and the second cover 20 is connected and fixed to the case 16.

According to the connection device having the above-described structure, the engaging claws 30 are each configured to comprise two engaging protrusions 32 formed into a flat plate shape and opposing each other in the width direction, which are to respectively engage the pair of engaging projections 54 of the receiving portion 50. With such a configuration, if an external force is applied in a direction of extracting the engaging claw 30 from the receiving portions 50, the two engaging protrusions 32 is pressed against the pair of engaging projections 54. Here, the forces acting on the two engaging protrusions 32 cancel each other, and particularly, the forces to bend the engaging protrusions 32 cancel each other, thus inhibiting the engaging protrusions 32 from bending. With this structure, if the angle θ made between the inclined surface 32a of the respective engaging protrusion 32 and the side surface 31 of the respective engaging claw 30 is greater than 90°, for example, as large as about 150°, the engaging protrusion 32 does not detach from the engaging projection 54. Further, by setting the angle θ greater than 90°, the stress acting on the intersection between the inclined surface 32a and the respective side surfaces 31 is relaxed, thus making it possible to inhibit occurrence of cracks. As described, according to this embodiment, a connection device which can inhibit the detaching of the engaging claws 30 or damage of the claws, and thus can maintain a firm connection state, can be provided.

Next, an connection device concerning a modified example will be described. Note that, in the modified example described below, the same parts as those of the above-described embodiment will be referred to by the same reference signs, and the detailed descriptions thereof may be omitted or simplified.

Modified Example

Figure 9:
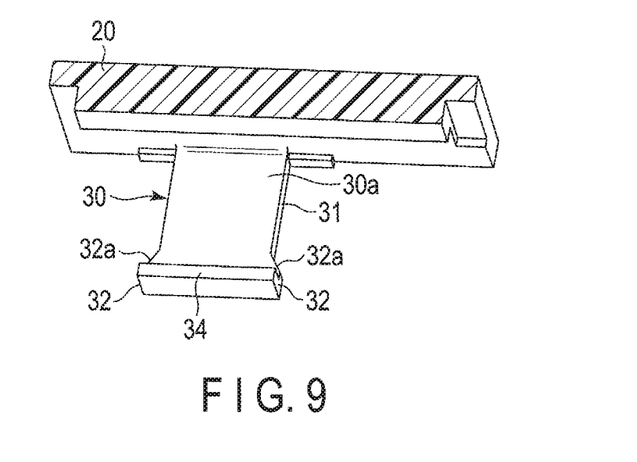
FIG. 9 is perspective view showing an engaging claw of a connection device according to a first modified example.

FIG. 9 is a perspective view showing an engaging claw of a connection device according to the modified example. As shown, the engaging claw 30 may comprise a thick portion (reinforcement rib) formed in an extending end portion. The reinforcement rib 34 is formed to project from a first main surface 30a of the engaging claw 30. The reinforcement rib 34 is formed to extend in a direction normal to the extending direction A of the engaging claw 30, that is, the width direction of the engaging claw 30 and overlap the extending end portion of the engaging claw 30 and a pair of engaging protrusions 32. The reinforcement rib 34 is formed integrally with the encaging claw 30 as one body.

With the reinforcement rib 34, the twisting of the engaging claw 30 can be inhibited, and a further strong connection that is hard to detach can be maintained.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

For example, the number of engaging claws provided in the first member is not limited to one pair, but it may be only one or three or more. The members in which the engaging claws of the connection device and the receiving portion are not limited to a combination of a cover (lid) and a housing, but such a structure can as well be adopted that the engaging claw is provided in some other member, for example, a plug and a receiving portion is formed in a socket of the housing side. Further, the first member and the second member are applicable to various kinds of members. The material, shape, size and the like of the material to construct the connection device are not limited to those of the embodiment and example described above, but can be variously changed as needed.

The shape of the engaging claws is not limited to a plate shape, but may be a pillar shape such as a columnar or a cylindroidal, or the like. Further, such a structure may as well be adopted that the engaging claw includes a carved or bent first main surface and a flat second main surface. In the case there the second main surface of the engaging claw is a curved surface, the bottom surface of the holder portion of the receiving portion 50 (for example, the inner surface of the sidewall) may be formed as a bottom surface curved to match the engaging claw.

What is claimed is:

1. A connection device comprising:
   an engaging claw extending in a first direction from a first member, and a receiving portion provided in a second member, to fit with the engaging claw;
   the engaging claw comprising a pair of first side surfaces each extending in the first direction and opposing each other with an interval therebetween, and a pair of engaging protrusions provided in an extending end portion of the engaging claw and each projecting out from the respective first side surface in a direction intersecting the first direction, the engaging protrusions each comprising an inclined surface continuous from the first side surfaces and extending to be inclined to the first direction, and
   the receiving portion comprising an insertion opening to which the engaging claw is inserted, a pair of slopes extending in the first direction and each including a second side surface engaging the first side surface, and an engaging projection connected to the second side surface, the engaging projection engaging the engaging protrusion.

2. The connection device of claim 1, wherein
   an angle made between the first side surface of the engaging claw and the inclined surface is greater than 90°.
3. The connection device of claim 2, wherein
   the angle is 120° to 150°.
4. The connection device of claim 1, wherein
   the receiving portion comprises a pair of slopes each including a guide surface extending to be inclined from the bottom surface towards the projecting end of the engaging projection along the first direction, and
   an interval between the pair of slopes is greater than an interval between the pair of first side surfaces of the engaging claws and is less than an interval between the pair of engaging projections.
5. The connection device of claim 4, wherein
   the engaging claw comprises a first main surface intersecting the pair of first side surfaces and a second main surface opposing the first main surface.
6. The connection device of claim 5, wherein
   the engaging claw is formed of synthetic resin and is elastically deformable in a direction intersecting the first main surface.
7. The connection device of claim 5, wherein
   the engaging claw comprises a reinforcement rib provided to overlap the first main surface and the pair of the engaging protrusions.
8. The connection device of claim 1, wherein
   the engaging claw comprises a first main surface intersecting the pair of first side surfaces and a second main surface opposing the first main surface.
9. The connection device of claim 1, wherein, each of the engaging projections comprises an engaging surface inclined to the first direction, the engaging surface engaging the inclined surface of the engaging protrusion.

* * * * *